United States Patent
Kiyokawa et al.

[11] Patent Number: 5,172,049
[45] Date of Patent: Dec. 15, 1992

[54] IC TEST EQUIPMENT

[75] Inventors: Toshiyuki Kiyokawa, Kitakatsushika; Hisao Hayama, Gyoda, both of Japan

[73] Assignee: Advantest Corporation, Tokyo, Japan

[21] Appl. No.: 775,562

[22] Filed: Oct. 15, 1991

[30] Foreign Application Priority Data

Oct. 15, 1990 [JP] Japan .............. 2-107734[U]

[51] Int. Cl.$^5$ ............................................. G01R 31/02
[52] U.S. Cl. .................... 324/158 F; 219/209; 324/73.1
[58] Field of Search ............ 324/158 F, 158 P, 158 R, 324/73.1; 219/209; 361/385

[56] References Cited

U.S. PATENT DOCUMENTS

| | | | |
|---|---|---|---|
| 3,710,251 | 1/1973 | Hagge et al. | 324/158 F |
| 4,212,075 | 7/1980 | Cleversey et al. | 324/73.1 |
| 5,023,544 | 6/1991 | Vallone et al. | 324/73.1 |
| 5,084,671 | 1/1992 | Miyata et al. | 324/158 F |

Primary Examiner—Ernest F. Karlsen
Attorney, Agent, or Firm—Staas & Halsey

[57] ABSTRACT

In IC test equipment in which an IC element sucked by an air chuck is carried in the horizontal direction by an X-Y transport unit and the air chuck is lowered toward a test head to load the IC element onto a socket provided on a performance board for test, the socket has a contact housing room defined by a bottom panel and a surrounding wall raised about the periphery thereof, in which spring contacts are arranged, and a planar heat cap made of metal is placed on the socket. In a hole made in the heat cap there are buried a heater and a temperature sensor. The heat cap has a centrally-disposed through hole for receiving the IC element. The through hole is closed to shield the contact housing room from the outside when the air chuck is brought down to the socket.

5 Claims, 3 Drawing Sheets

IC TEST EQUIPMENT

BACKGROUND OF THE INVENTION

The present invention relates to IC test equipment of the type wherein IC elements are brought in a horizontal plane to a predetermined position for testing them.

IC elements are classified into various types according to their terminal lead-off configuration. Of them, an IC element of the type having its terminals led out from four sides of a plastic molding is difficult to slide directly on a guide rail. Conventionally, an X-Y transport mechanism is used by which chucks having sucked thereto such IC elements are carried in the X-Y direction, i.e. in the horizontal direction and are mounted on sockets provided on a performance board of a test head. The X-Y transport mechanism includes X-axis guide rails, a Y-axis guide rail movable on the X-axis guide rails in the X-axis direction, and a carrier head movable on the Y-axis guide rail in the Y-axis direction. The carrier head has vertical drivers each of which is driven by an air cylinder, for example, and air chucks affixed to the vertical drivers and driven in the vertical direction and suck up thereto and hold IC elements.

FIG. 1 shows the construction of each of the socket and the air chuck for use in the conventional IC test equipment. Reference numeral 10 indicates an IC element to be tested. The IC element 10 has its terminals 11 led out from four sides of a plastic molding as referred to above. The terminals 11 are held by terminal holders 21 of an insulating material, protrusively provided on an air chuck 20, and are urged into contact with spring contacts 31 of a socket 30. The socket 30 is packaged on a performance board PB. The performance board PB, the socket 30 and a circuit provided on the underside of the performance board PB constitute a test head.

The air chuck 20 has a centrally-disposed air suction hole 22 and sucks in air through the air suction hole 22 to suck up the IC element 10. The air chuck 20 is equipped with a heater 23 so that the IC element 10 can be tested under a thermally stressed condition. The air chuck 20 is heated by the heater 23 to maintain the temperature of the IC element 10 under test. This embodiment is shown to employ a hot plate, as means for preheating the IC element 10, to prevent that the throughput of testing all IC elements decreases due to the time required for heating each of them up to a predetermined temperature in advance to each test. That is to say, a plurality of IC elements to be tested are placed on the hot plate (not shown) heated at a predetermined temperature so that they are subjected to a predetermined thermal stress. The IC elements 10 thus preheated are each sucked up by the air chuck 20 and carried to the socket 30. For such a reason, the air chuck 20 is also provided with the heater 23 for holding the temperature of the chuck 20 close to the temperature of the preheated IC element 10 to prevent the temperature of the latter from dropping during transportation.

While the IC element 10 sucked by the air chuck 20 is being carried toward the socket, the heater 23 keeps the temperature of the IC element 10 unchanged. On the other hand, the socket 30 is held at room temperature, and consequently, when the IC element 10 is attached to the socket 30, the heat stored in the former escapes through the terminals 31 of the latter, resulting in the lowered temperature of the IC element 10. On this account, the prior art is defective in that IC elements are not always tested at predetermined temperatures.

SUMMARY OF THE INVENTION

It is therefore an object of the present invention to provide IC test equipment which does not lower the temperature of an IC element preheated by the hot plate even after it is transferred to and loaded into the socket for test.

In the IC test equipment of the present invention in which IC elements to be tested are thermally stressed by the hot plate, sucked up therefrom by air chucks mounted on the carrier head, brought by the carrier head to the test head and then loaded into the socket for testing, there are provided a heater and a temperature sensor on the socket, keeping its temperature constant.

With the arrangement of the present invention, it is possible therefore to maintain the socket at the same temperature as that of the IC element to be tested. Accordingly, the temperature of the IC element does not lower even after it is loaded into the socket. This ensures testing of IC elements exactly at predetermined temperatures, and hence provides for unchanged reliability in the test.

DESCRIPTION OF THE PREFERRED EMBODIMENT

Figure 2:
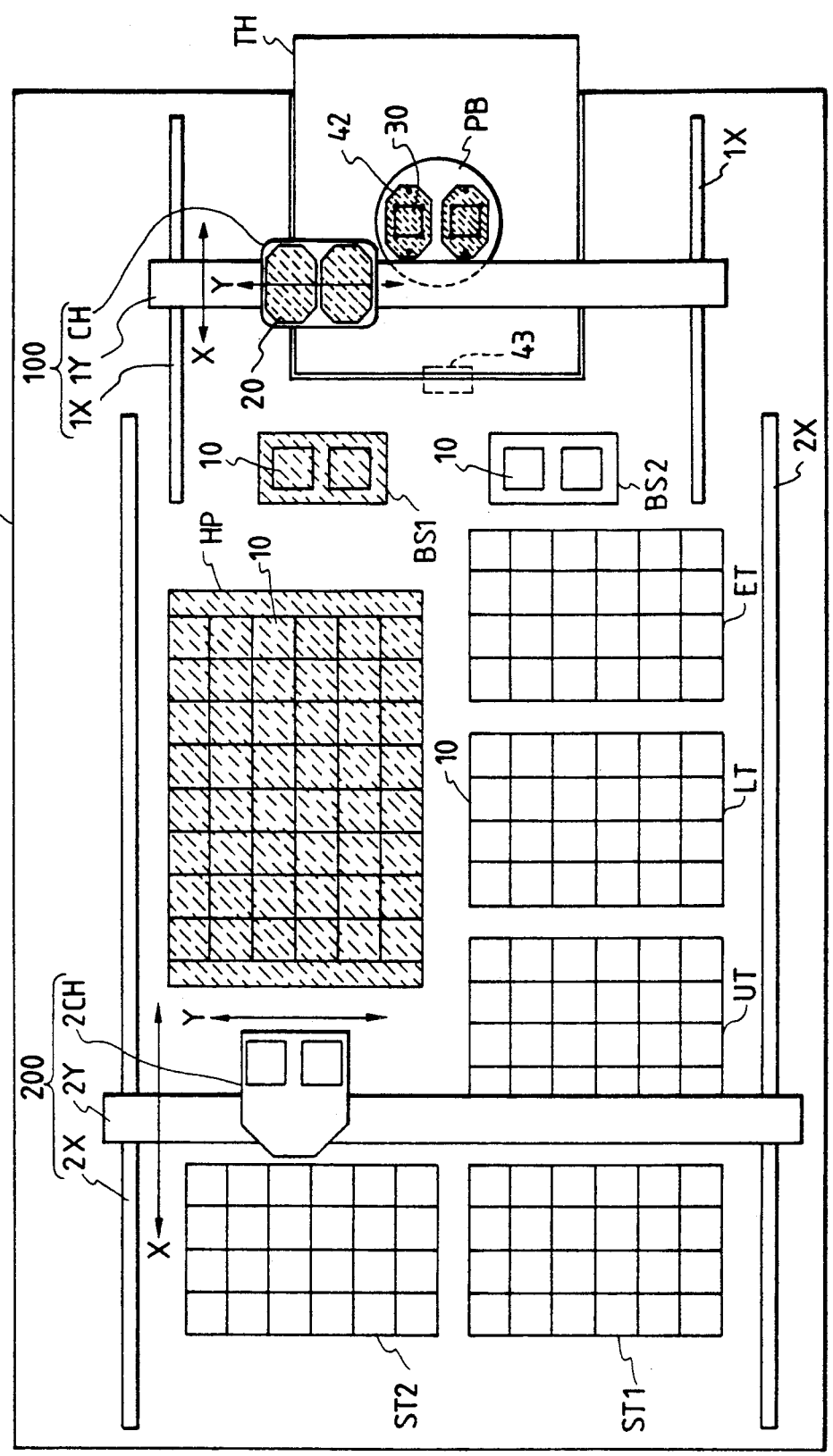
FIG. 2 is a plan view showing mainly a a horizontal transport mechanism of IC test equipment embodying the present invention.

FIG. 2 is a plan view schematically showing the horizontal transport mechanism of IC test equipment embodying the present invention. In this example there are mounted on a support frame SF a first X-Y transport unit 100 which carries IC elements to be tested 10 from a first buffer stage BS1 held at a predetermined temperature to the performance board PB of a test head TH and attaches the IC elements 10 to the sockets 30 on the performance board PB and carries tested IC elements 10 from the performance board PB to a second buffer stage BS2, and a second X-Y transport unit 200 which carries IC elements to be tested 10 from a loader tray LT to a hot plate HP held at a predetermined temperature and thence to the first buffer stage BS1, or from the loader tray LT directly to the first buffer stage BS1 and carries tested IC elements 10 from the second buffer stage BS2 to any one of an unloader tray UT and sort trays ST1 and ST2. This structure, in its entirety, is commonly referred to as an IC handler. Accordingly, the first and second X-Y transport units 100 and 200 can be operated in parallel to increase throughput.

The first X-Y transport unit 100 has two X-axis guide rails 1X, a Y-axis guide rail 1Y movable thereon in the X-axis direction, and an X-Y carrier head CH movable on the Y-axis guide rail 1Y in the Y-axis direction. The second X-Y transport unit 200 has two X-axis guide rails 2X, a Y-axis guide rail 2Y movable thereon in the X-axis direction, and an X-Y carrier head 2CH movable on the Y-axis guide rail 2Y in the Y-axis direction. The present invention concerns IC test equipment having, for example, such a horizontal transport mechanism, and in particular, pertains to the air chuck 20 provided on the first X-Y transport unit 100 in a manner to be movable in the vertical direction, for holding the IC element 10, and the socket 30 on the performance board PB to which the IC element 10 carried by the air chuck 30 is attached. Hence, the first X-Y transport mechanism 100 will hereinafter be referred to simply as the X-Y transport unit or horizontal transport mechanism as well. Further, the following description will be given, in some cases, on the assumption that the first buffer stage BS1 forms part of the hot plate HP.

Figure 1:
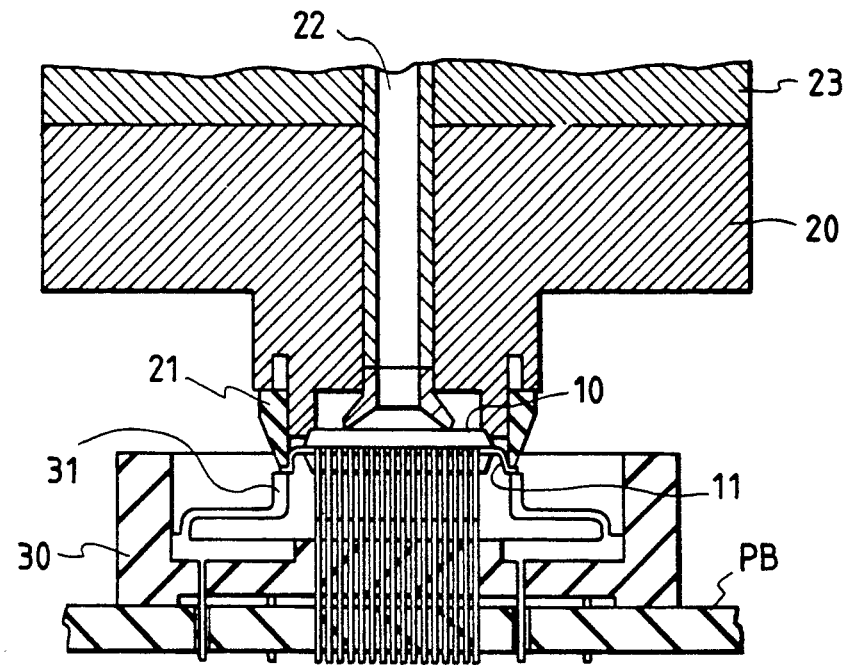
FIG. 1 is a sectional view showing the relationship between an air chuck and a socket of IC test equipment.
Figure 3:
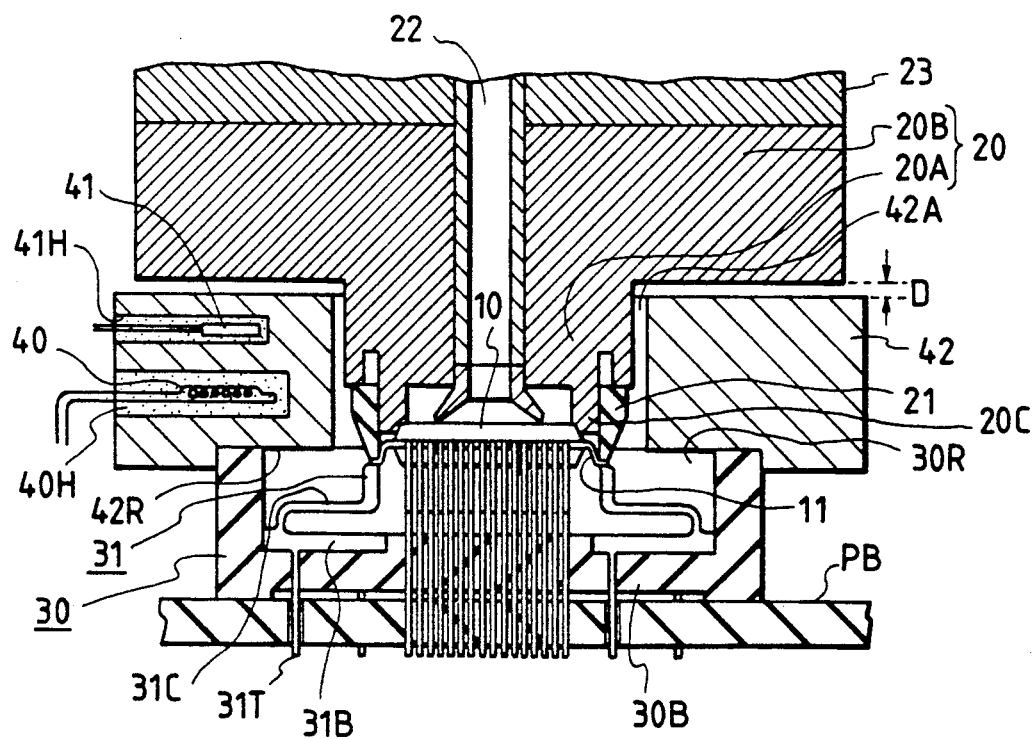
FIG. 3 is a sectional view illustrating the relationship between the air chuck and the socket.

FIG. 3 illustrates, in section, the IC socket 30 and the tip end portion of the air chuck 20 holding an IC element loaded on the socket 30. In FIG. 3 the parts corresponding to those in FIG. 1 are identified by the same reference numerals. In this embodiment a heat cap 42 made of a good thermal conductor is mounted on top of the socket 30 and a heater 40 and a temperature sensor 41 are mounted in the heat cap 42. Thus, the socket 30 is provided with the heater 40.

Figure 4:
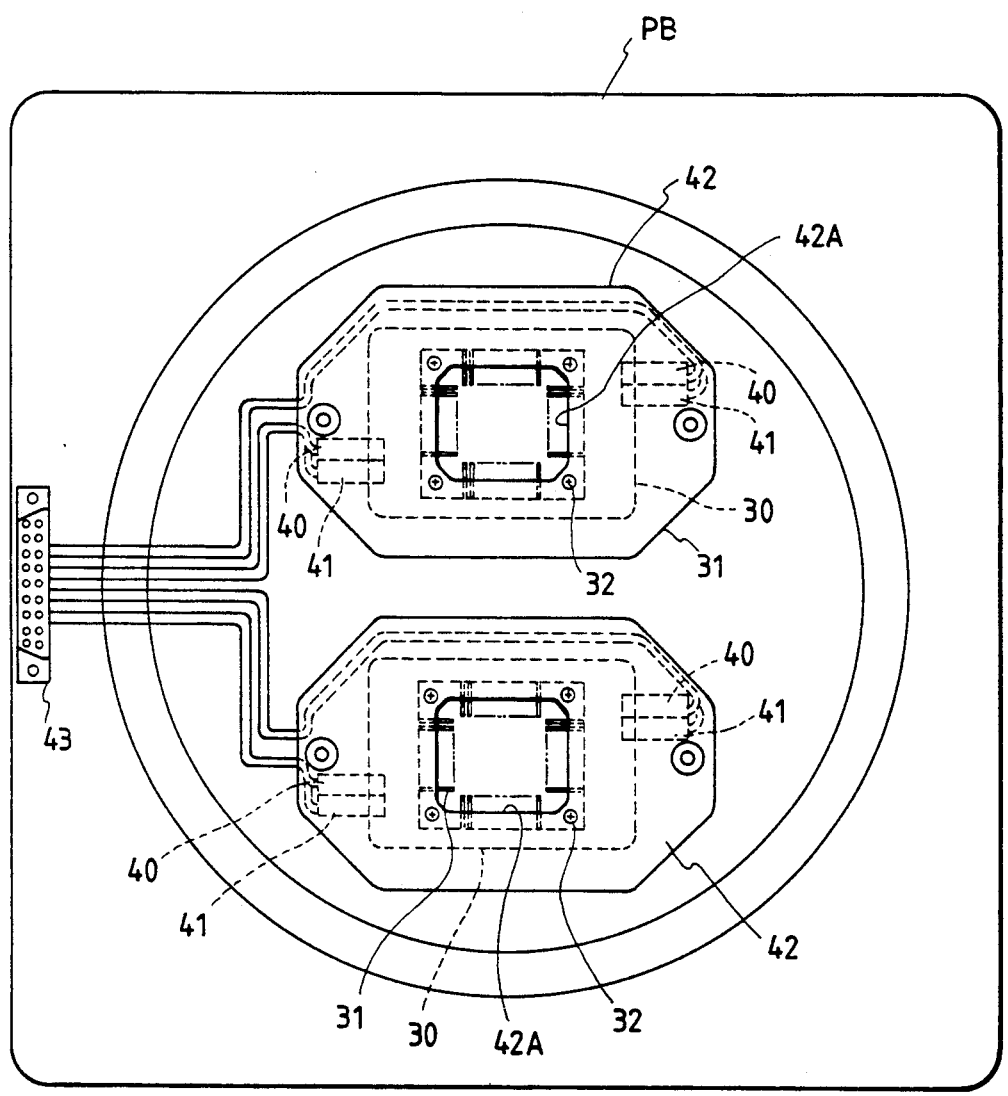
FIG. 4 is a plan view of the socket on a performance board.

The socket 30 (see FIG. 4 as well) formed of an insulator is substantially rectangular in shape and has a bottom panel 30B and a surrounding wall 30W raised about its periphery, forming a contact housing 30R inside thereof. In the contact housing room 30R spring contacts 31 are arranged along the surrounding wall 30W on the four sides defining the contact housing room 30R. Each contact 31 has an L-shaped contact portion 31C, its base portion 31B and a terminal portion 31T. The free end of the contact portion 31C forms an upward face for receiving corresponding one of the terminals 11 of the IC element 10 and the other end is bent downward and merged into the base portion 31B near its one end. The base portion 31B is in the form of a horizontally elongated thin narrow plate and is buried in the bottom panel 30B of the socket 30. The terminal portion 31T extends downward from the underside of the base portion 31B and passes through the bottom panel 31B of the socket 30 and through the performance board PB and is connected to an internal circuit (not shown) of the test head TH.

The heat cap 42 is a flat polygonal block as of copper or brass and has centrally thereof a through hole 42A smaller than the contact housing room 30R but larger than the IC element 10 in length and in width. In the underside of the heat cap 42 there is formed a recess 42R around the through hole 42A. The heat cap 42 is mounted over the socket 30, with the top end portion of the latter snugly fitted or received in the recess 42R of the former, and the socket 30 is fixed by screws 32 to the performance board PB. The heater 40 and the temperature sensor 41 are buried in holes 40H and 41H made in the heat cap 42 and extending from its outer peripheral surface toward its center. The heater 40 heats the heat cap 42, which, in turn, heats the socket 30.

The air chuck 20 has a substantially square-sectioned lower end portion 20A which is loosely received in the through hole 42A and an enlarged upper portion 20B whose underside faces the top of the heat cap 42. There is provided an air suction hole 22 which extending through the heater 23 and the air chuck axially thereof. Though not shown, a chuck holding means is provided above the heater 23 and is held by a vertical drive unit (not shown) mounted in the X-Y carrier head CH. The chuck holding means is moved up and down by the vertical drive unit, by which the air chuck is moved in the vertical direction correspondingly.

On the underside of the lower end portion 20A of the air chuck 20 there are protrusively provided around the air suction hole 22 downward mold guides 20C corresponding to four sides of a plastic mold of the IC element 10. Further, terminal holders 21 of an insulating material, each having a wedge-like cross-section, are bonded to the underside of the lower end portion 20A of the air chuck 20 along its four sides. The air chuck 20 is designed so that when having sucked up the IC element 10 by sucking air through the air suction hole 22 with use of an air suction system (not shown), recessed inner marginal edges of the mold guides 20C receive upper edges of the plastic mold of the IC element 10 to position it and respective lower edges of the four terminal holders 21 hold down the terminals 11 extending from the four sides of the IC elements 10. In this embodiment the terminal holders 21 are formed of sapphire which is excellent in thermal conductivity, so as to compensate for heat losses resulting from radiation from the terminals 11 of the IC element 10 through the spring contacts 31.

When the air chuck 20 has been brought down and loaded the IC element 10 in the socket 10, the through hole 42A is substantially closed with the lower end portion 20A of the air chuck 20 heated by the heater 23 and the contact housing room 30R is essentially closed, and hence can easily be held at a fixed temperature. Accordingly, the IC element 10 can be held at a desired temperature during test. Moreover, when the air chuck 20 has lowered a predetermined distance D after the terminals 11 of the IC element 10 made contact with the free ends of the spring contacts 31, the underside of the enlarged upper portion 20B of the air chuck 20 abuts against the top of the heat cap 42, limiting further downward movement of the air chuck 20.

The distance D is within a given limit of deformation of the contact portions 31C of the spring contacts 31. The distance D and the modulus of elasticity of the spring contacts 31 are selected properly so that when the contact portions 31C are displaced by the distance D, a fixed quantity of reaction is applied to the terminals 11. The distance D can be obtained with high accuracy, simply by adjusting the height of the plane in which the terminal holders 21 are provided and the height of each mold guide 20C. In contrast to this, in the prior art example of FIG. 1 it is necessary that the accuracy of setting the drive stroke of the vertical drive unit for driving the air chuck in the vertical direction and the accuracy of the position of the carrier head relative to the socket in the vertical direction be fully high, besides the X-Y transport unit is required to have high rigidity sufficient to reproduce such high degree of accuracy for each IC transportation.

The heater 30 and the temperature sensor 41 mounted in the heat cap 42 are connected to a connector 43 via wiring patterns or lead wires formed on the performance board PB and is connected via the connector 43 to a controller (not shown, in particular) of the IC handler depicted in FIG. 2. The controller of the IC handler effects drive control of the X-Y transportation unit and temperature control of the first buffer stage BS1 and the heater 23.

As described above, according to the present invention, the socket 30 mounted on the test head TH is provided with the heater 40 and the temperature sensor 41, by which the socket 30 can be heated to a fixed temperature. Hence, when the IC element to be tested 10 has been loaded on the socket 30, no heat will escape from the former to the latter. In other words, the IC element 10 can be tested under a predetermined temperature condition.

Furthermore, the heat cap 42 is provided and the air chuck 20 is loosely received in the through hole 42A of the heat cap 42, by which the contact housing room 30R is shielded essentially from the outside, so that the IC element 10 can be held at a constant temperature with ease. In addition, it is possible to obtain an arrangement in which when the air chuck 20 abuts against the top of the heat cap 42, the terminal holders 21 apply an appropriate fixed contact pressure to the terminal 11 of the IC element 10. With such an arrangement, the heat cap 42 serves as a limiter for limiting the contact pressure to the socket 30 to prevent the application of an excessive amount of force to the spring contacts 31 of the socket 30. Besides, the terminals 11 and the spring contacts 31 can be contacted at a fixed pressure with high reproducibility.

It will be apparent that many modifications and variations may be effected without departing from the scope of the novel concepts of the present invention.

What is claimed is:

1. IC test equipment, including an X-Y carrier head, in which an IC element to be tested is thermally stressed, as predetermined, on a hot plate, said IC test equipment comprising:

sucking means for sucking up the IC element from the hot plate, said sucking means mounted on said X-Y carrier head and provided with heating means;

socket means for receiving the IC element from the X-Y carrier head on a performance board mounted on a test head, said test head testing the operation of the IC element, said socket means including;

a socket comprising:
   a bottom panel of an insulating material, for arranging thereon spring contacts which elastically contact terminals of the IC element and a surrounding wall raised about the periphery of said bottom panel to surround the arrangement of said spring contacts; and
   a heat cap made of metal and mounted on said socket, said heat cap resting on said surrounding wall in a manner to cover an upper opening of said socket defined by said surrounding wall, said heat cap having a centrally-disposed through hole for receiving the IC element;

heater means buried in said heat cap, for heating said heat cap; and temperature sensor means buried in said heat cap, for detecting the temperature of said heat cap;

the lower end portion of said sucking means shaped to substantially fill said through hole in said heat cap sot hat a substantially shielded room housing the IC element is formed when said sucking means is lowered to load the IC element on said socket.

2. IC test equipment according to claim 1, wherein a portion of said sucking means above said lower end portion is larger than said through hole and abuts against the top of said heat cap to prevent said sucking means from further descending.

3. IC test equipment according to claim 1, further comprising terminal holding means made of an insulating material provided on the underside of said sucking means, for pressing and holding said terminals extending from respective sides of the IC element down to said spring contacts.

4. IC test equipment according to claim 3, wherein said terminal holding means comprises a plate of sapphire corresponding to each side of the IC element, said terminals being simultaneously pressed, by one side of said sapphire plate, into contact with free ends of said spring contacts corresponding thereto.

5. IC test equipment according to claim 2, further comprising terminal holding means made of an insulating material provided on the underside of said sucking means, for pressing and holding said terminals extending from respective sides of the IC element down to said spring contacts.

* * * * *